United States Patent
Narasimhan et al.

(10) Patent No.: US 10,900,718 B2
(45) Date of Patent: Jan. 26, 2021

(54) APPARATUS, SYSTEM, AND METHOD FOR IMPROVING THE EFFICIENCY OF HEATSINKS

(71) Applicant: Juniper Networks, Inc., Sunnyvale, CA (US)

(72) Inventors: Susheela Nanjunda Rao Narasimhan, Fremont, CA (US); Christopher Otte, Sunnyvale, CA (US); Darron Holley, Morgan Hill, CA (US); Chee Chin Wong, Cupertino, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 0 days.

(21) Appl. No.: 15/985,668

(22) Filed: May 21, 2018

(65) Prior Publication Data
US 2019/0353430 A1 Nov. 21, 2019

(51) Int. Cl.
| | |
|---|---|
| *F28D 15/02* | (2006.01) |
| *F28F 3/04* | (2006.01) |
| *H05K 7/20* | (2006.01) |
| *F28D 21/00* | (2006.01) |

(52) U.S. Cl.
CPC .......... *F28D 15/0233* (2013.01); *F28F 3/04* (2013.01); *H05K 7/2039* (2013.01); *H05K 7/20327* (2013.01); *H05K 7/20936* (2013.01); *F28D 2021/0029* (2013.01)

(58) Field of Classification Search
CPC .......... F28D 15/0233; F28F 3/04; H05K 7/20; H05K 7/20327; H05K 7/2039; H05K 7/20936
See application file for complete search history.

(56) References Cited

U.S. PATENT DOCUMENTS

| | | | |
|---|---|---|---|
| 5,253,702 A * | 10/1993 | Davidson | F28D 15/0233 165/80.4 |
| 5,632,158 A * | 5/1997 | Tajima | F28D 15/0266 165/104.26 |
| 6,490,160 B2 | 12/2002 | Dibene | |

(Continued)

FOREIGN PATENT DOCUMENTS

JP 2001183079 A * 7/2001 ......... F28D 15/0233

OTHER PUBLICATIONS

Heat Pipes and Vapor Chambers—What's the Difference?; https://celsiainc.com/blog-heat-pipes-and-vapor-chambers-whats-the-difference (Mar. 4, 2015).

(Continued)

*Primary Examiner* — Travis C Ruby
*Assistant Examiner* — Harry E Arant
(74) *Attorney, Agent, or Firm* — FisherBroyles, LLP (57) ABSTRACT

The disclosed apparatus may include (1) a heatsink that includes a first vapor chamber that (A) contains fluid that dissipates heat and (B) is at least partially encompassed by a plate that contains at least one slot extending from a top surface of the plate to the first vapor chamber and (2) at least one fin that (A) encompasses a second vapor chamber (B) is secured within the slot in the plate of the heatsink such that (i) the fin extends from the heatsink and (ii) the fluid within the first vapor chamber is capable of flowing into the second vapor chamber. Various other apparatuses, systems, and methods are also disclosed.

19 Claims, 12 Drawing Sheets

(56) References Cited

U.S. PATENT DOCUMENTS

| | | | | |
|---|---|---|---|---|
| 2005/0280162 A1* | 12/2005 | Mok | ............... | H01L 23/427 |
| | | | | 257/778 |
| 2006/0060330 A1* | 3/2006 | Siu | ............... | F28D 15/0233 |
| | | | | 165/104.26 |
| 2007/0272399 A1* | 11/2007 | Nitta | ............... | F28D 15/046 |
| | | | | 165/185 |
| 2018/0164049 A1* | 6/2018 | Okuaki | ............ | H05K 7/20918 |

OTHER PUBLICATIONS

MTE Explains: What is Vapor Chamber Cooling?; https://www.maketecheasier.com/what-is-vapor-chamber-cooling (Oct. 24, 2016).

Alexander I. Yatskov, et al.; Apparatus, System, and Method for Improving Heat Transfer Between Heatsinks and Optical Transducers Within Telecommunications Devices; U.S. Appl. No. 15/937,787, filed Mar. 27, 2018.

\* cited by examiner

APPARATUS, SYSTEM, AND METHOD FOR IMPROVING THE EFFICIENCY OF HEATSINKS

BACKGROUND

Heatsinks are often a critical component of electronic and mechanical devices. For example, power dissipated by a device may generate heat, thereby causing the operating temperature of the device to rise. If the operating temperature increases above a certain level, components of the device may overheat, malfunction, or even break. As such, many devices may be equipped with heatsinks designed to transfer and/or dissipate heat. In general, a heatsink may contain and/or represent a thermally conductive material that transfers heat away from an operational device, thereby cooling the device and/or enabling the device to achieve optimal performance.

The operating temperature of a device may generally correlate to the amount of power dissipated by the same. As technological advancements increase the amount of power certain devices (such as microprocessors and integrated circuits) are capable of dissipating, such devices may need and/or call for more efficient and/or effective heatsinks. This problem may be exacerbated by increasingly smaller chip sizes (which may necessitate correspondingly smaller heatsinks).

Traditional systems for improving the efficiency of heatsinks may involve combining standard heatsinks with additional heat-dissipating components such as heat pipes, vapor chambers, and/or fins. Unfortunately, even these advancements may be unable to sufficiently cool many modern devices. For example, a conventional heatsink assembly may involve passing heat from a heatsink to a fin via a heat pipe. While this conventional assembly may provide more efficient cooling than a simple heatsink, the overall cooling ability of the assembly may be limited and/or reduced by inefficiencies inherent in transferring heat via more than one type of heat-transfer mechanism. As such, this conventional assembly may be unable maintain an ideal operating temperature for a high-power device.

The instant disclosure, therefore, identifies and addresses a need for additional apparatuses, systems, and methods for improving the efficiency of heatsinks.

SUMMARY

As will be described in greater detail below, the instant disclosure generally relates to apparatuses, systems, and methods for improving the efficiency of heatsinks. In one example, an apparatus for performing such a task may include (1) a heatsink that includes a first vapor chamber that (A) contains fluid that dissipates heat and (B) is at least partially encompassed by a plate that contains at least one slot extending from a top surface of the plate to the first vapor chamber and (2) at least one fin that (A) encompasses a second vapor chamber (B) is secured within the slot in the plate of the heatsink such that (i) the fin extends from the heatsink and (ii) the fluid within the first vapor chamber is capable of flowing into the second vapor chamber.

Similarly, a system incorporating the above-described apparatus may include (1) a device that generates heat, (2) a heatsink that (A) is coupled to the device and (B) includes a first vapor chamber that (i) contains fluid that dissipates heat and (ii) is at least partially encompassed by a plate that contains at least one slot extending from a top surface of the plate to the first vapor chamber, and (3) at least one fin that (A) encompasses a second vapor chamber and (B) is secured within the slot in the plate of the heatsink such that (i) the fin extends from the heatsink and (ii) the fluid within the first vapor chamber is capable of flowing into the second vapor chamber.

A corresponding method may include (1) creating a first vapor chamber between (A) a bottom plate of a heatsink and (B) a top plate of a heatsink, the top plate containing at least one slot extending from a top surface of the top plate to the first vapor chamber, (2) creating a second vapor chamber within a fin that is dimensioned to fit within the slot in the top plate of the heatsink, and (3) securing the fin within the slot in the top plate of the heatsink such that (A) the fin extends from the heatsink (B) heat-dissipating fluid within the first vapor chamber is capable of flowing into the second vapor chamber.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for improving the efficiency of heatsinks. As will be explained in greater detail below, embodiments of the instant disclosure may increase the amount of heat a heatsink is capable of dissipating by creating one or more vapor chambers that extend from a cavity within the heatsink to a fin attached to the heatsink. For example, the disclosed apparatuses, systems, and methods may secure and/or position various components of a vapor chamber (such as a wick structure) within a fin designed to be secured to a heatsink base. These disclosed apparatuses, systems, and methods may also create one or more vapor chambers within the heatsink base. Specifically, the disclosed apparatuses, systems, and methods may position a vapor chamber underneath a slot in the top of the heatsink base.

By securing the vapor chamber fin within this slot, the disclosed apparatuses, systems, and methods may connect the vapor chambers within each component, thereby creating a contiguous vapor chamber that extends between both components. By doing so, these apparatuses, systems, and methods may enable working fluid inserted into the vapor chamber within the heatsink base to flow to the vapor chamber within the attached fin. Some embodiments of the instant disclosure may secure multiple vapor chamber fins to a heatsink base, thereby creating a heatsink assembly containing multiple extended vapor chambers.

Embodiments of the instant disclosure may provide more efficient and/or effective cooling for heat-generating devices than traditional heatsink systems. For example, by creating one or more extended vapor chambers within a heatsink assembly, the disclosed apparatuses, systems, and methods may enable the heatsink assembly to dissipate a greater amount of heat than a conventional heatsink (e.g., a heatsink whose attached fins do not include vapor chambers). In addition, these apparatuses, system, and methods may cool heat-generating devices to the same (or lower) temperatures as traditional heatsink systems using lower volumes of airflow. Such a reduction in airflow may reduce both the power required to generate the airflow and the acoustic effects produced by the airflow. The disclosed heatsink assemblies may provide various additional benefits and advantages over traditional heatsink systems, such as a reduced surface area and/or a smaller drop in temperature across the heatsink assemblies.

The following will provide, with reference to FIGS. 1-11, detailed descriptions of exemplary apparatuses, systems, and corresponding implementations for improving the efficiency of heatsinks. The discussion corresponding to FIG. 12 will provide a detailed description of an exemplary method for assembling these apparatuses, systems, and implementations for improving the efficiency of heatsinks.

Figure 1:
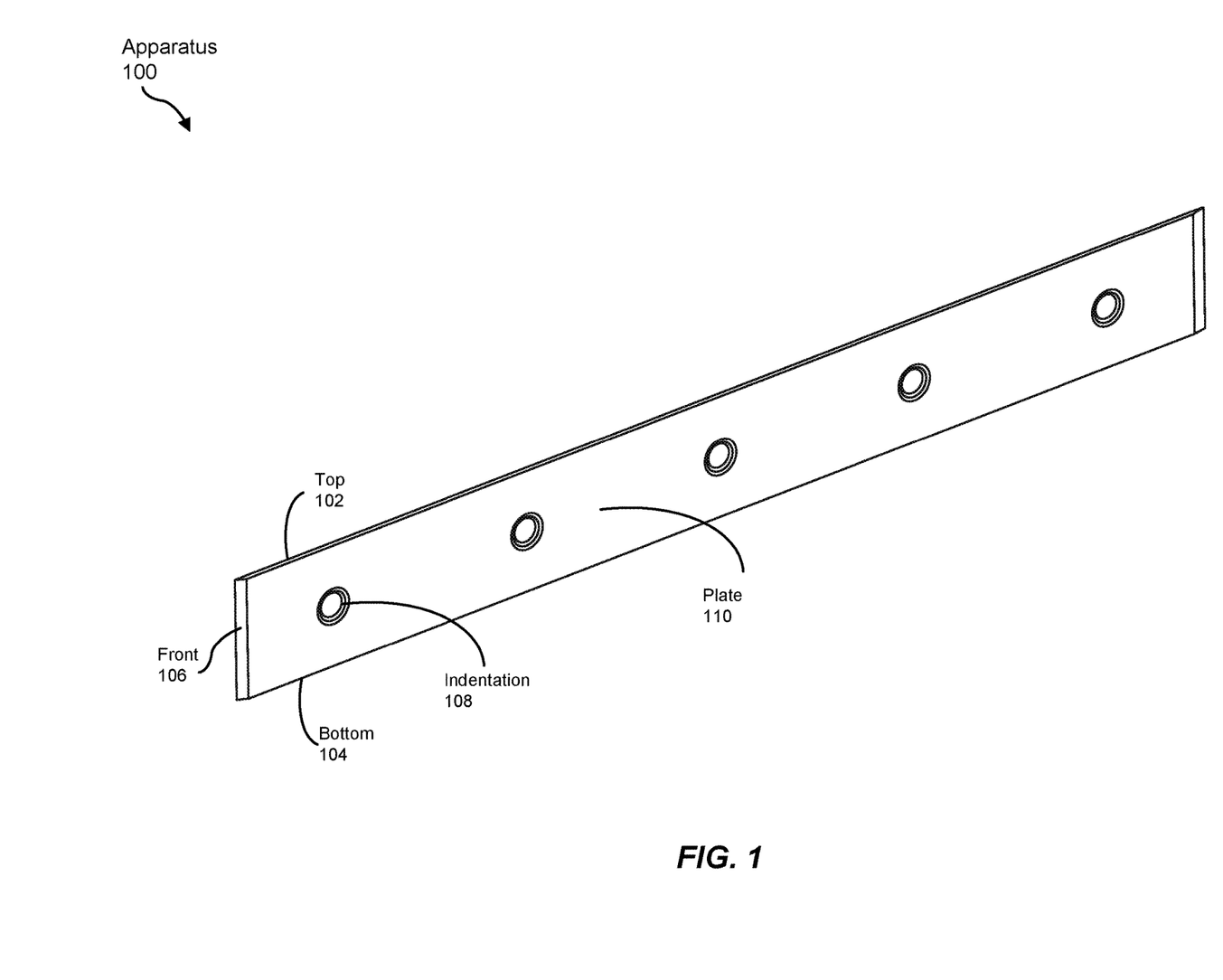
FIG. 1 is an illustration of an exemplary apparatus that improves the efficiency of heatsinks.

FIG. 1 illustrates an exemplary apparatus 100 for improving the efficiency of heatsinks. The term "heatsink," as used herein, generally refers to any type or form of system, device, structure, and/or mechanism that conducts, transfers, absorbs, and/or sinks heat. Heatsinks may include and/or contain a variety of materials. Examples of such heatsink materials include, without limitation, copper, aluminum, diamond, alloys of one or more of the same, combinations or variations of one or more of the same, and/or any other suitable materials.

In some examples, apparatus 100 may represent all or a portion of a heatsink. Additionally or alternatively, apparatus 100 may represent an attachment and/or extension that is coupled to a heatsink. For example, apparatus 100 may represent a fin or similar structure that is designed to be secured to a heatsink. In this example, apparatus 100 may include one or more heat-dissipating components that improve and/or facilitate the ability of the heatsink to transfer and/or dissipate heat. Specifically, apparatus 100 may include one or more vapor chambers.

The term "vapor chamber," as used herein, generally refers to any type or form of system, device, structure, and/or mechanism that transfers heat via a thermally conductive fluid. In some examples, a vapor chamber may include and/or encompass a working fluid that receives heat at one end (i.e., the warm end) of the vapor chamber. When the temperature of the fluid reaches the fluid's boiling point, the fluid evaporates. After evaporating, the fluid within the vapor chamber may move within the vapor chamber until reaching the other end (i.e., the cool end) of the vapor chamber. After reaching the cool end of the vapor chamber, the fluid may condense. This condensed fluid may then return to the warm end of the vapor chamber via mechanisms such as capillary action, centrifugal forces, and/or gravity. In some embodiments, condensed fluid may return to the warm end of a vapor chamber via a wick structure (e.g., a mechanism and/or material that facilitates movement of fluid in a liquid phase). This cycle of evaporation and condensation of the working fluid may continue to repeat while the vapor chamber receives heat from an external device.

In the example of FIG. 1, a vapor chamber may be positioned between and/or bounded by a plate 110 of apparatus 100 and an additional plate on the other side of apparatus 100 (not shown in FIG. 1). In this example, a bottom 104 of apparatus 100 may represent the warm end of the vapor chamber and a top 102 of apparatus 100 may represent the cool end of the vapor chamber. For example, bottom 104 of apparatus 100 may be coupled to a device that generates and/or stores heat (such as a heatsink).

As shown in FIG. 1, apparatus 100 may include one or more indentations, such as an indentation 108. Indentation 108 generally represents any type or form of dent and/or depression within plate 110. In some examples, the additional plate of apparatus 100 may contain a similar and/or corresponding indentation. For example, the additional plate may contain an indentation in the same location as indentation 108 within plate 110. In one embodiment, these indentations may touch (e.g., the indentations may extend far enough into each plate such that plate 110 and the additional plate make physical contact). In some examples, this pair of indentations may improve the stability and/or structural integrity of apparatus 100. For example, the contact between the indentations may help prevent the plates of apparatus 100 from deforming and/or bending.

Figure 2:
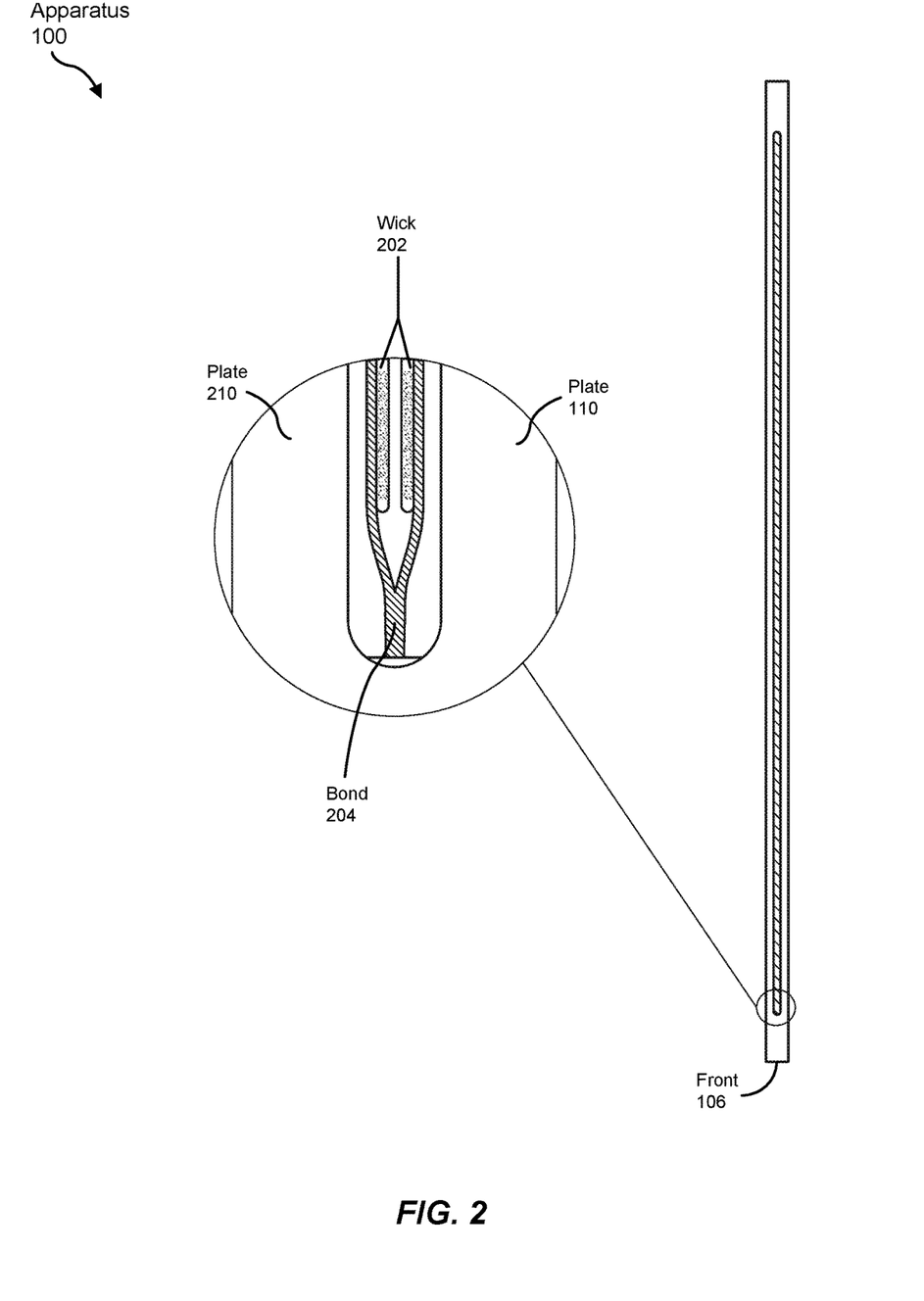
FIG. 2 is an additional illustration of an exemplary apparatus that improves the efficiency of heatsinks.

FIG. 2 illustrates a cross section of apparatus 100 that shows an exemplary configuration of a vapor chamber within apparatus 100. Specifically, FIG. 2 illustrates a cross section of apparatus 100 from the perspective of looking down at top 102 of apparatus 100. As shown in FIG. 2, apparatus 100 may include plate 110 and a plate 210. In one embodiment, plates 110 and 210 may be composed of a material (such as copper) that facilitates transferring and/or dissipating heat.

In some examples, plate 110 and plate 210 may encompass and/or be coupled to various components of a vapor chamber. For example, plates 110 and 210 may be coupled to a wick 202. In this example, wick 202 generally represents any type or form of wick structure (e.g., sintered metal powder, a screen wick, a grooved wick, etc.) that facilitates transferring condensed working fluid (e.g., water, ammonia, coolant, etc.) within apparatus 100. In one embodiment, wick 202 may represent and/or include two sheets of a wick material. In this embodiment, one sheet of this wick material may be coupled to the inner side of plate 110. The other sheet of wick material may be coupled to the inner side of plate 210. As will be explained in greater detail below, the space between the sheets of wick 202 may be at least partially filled with a working fluid.

In some embodiments, one or more sides of plate 110 may be securely bonded to one or more sides of plate 210. For example, the front sides (corresponding to front 106 of apparatus 100 in FIG. 1) of plates 110 and 210 may be securely bonded together. This bond is illustrated as a bond 204 in FIG. 2. Bond 204 may be created in a variety of ways, such as by welding, soldering, sealing, crimping, bolting, and/or otherwise fastening plates 110 and 210 together. Such a bond between plate 110 and plate 210 may secure working fluid within apparatus 100.

In some examples, the top sides (corresponding to top 102 of apparatus 100 in FIG. 2) of plates 110 and 210 may also be securely bonded together. In addition, the back sides (i.e., the sides opposite front 106) of plates 110 and 210 may be securely bonded together. However, the bottom sides of plates 110 may be 210 may not be bonded together. In this way, the bottom sides of plates 110 and 210 may create and/or provide an opening through which working fluid may flow into apparatus 100 from a heatsink to which apparatus 100 is secured.

Figure 3:
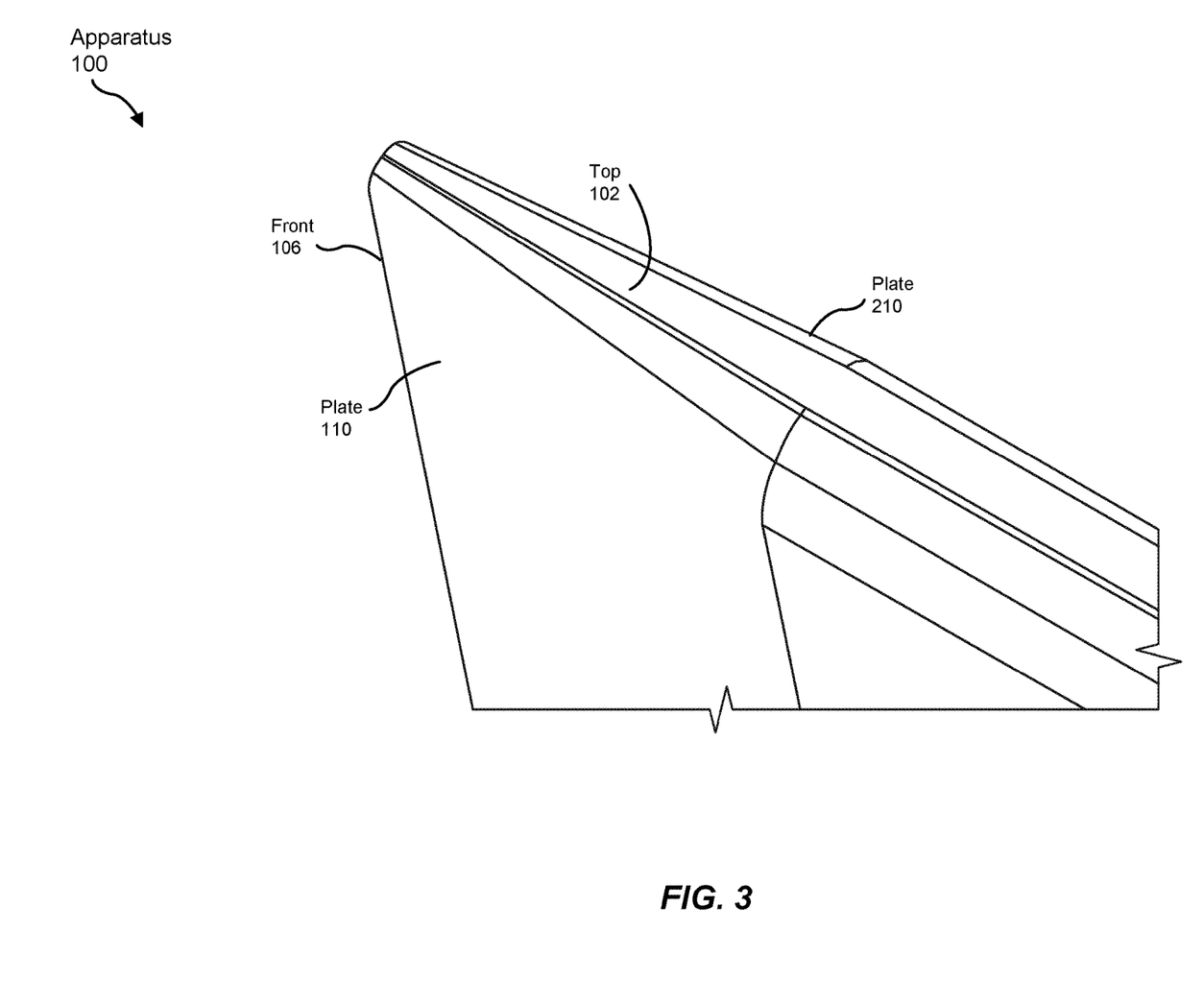
FIG. 3 is an additional illustration of an exemplary apparatus that improves the efficiency of heatsinks.

FIG. 3 illustrates an exemplary perspective view of apparatus 100. Specifically, FIG. 3 illustrates the outer appearance of plates 110 and 210 after the front and top sides of plates 110 and 210 have been bonded. As shown in FIG. 3, front 106 of apparatus 100 may be angled or pinched as the result of this bond. Plates 110 and 210 may be bonded and/or fastened together in any additional or alternative manner and/or configuration.

Figure 4:
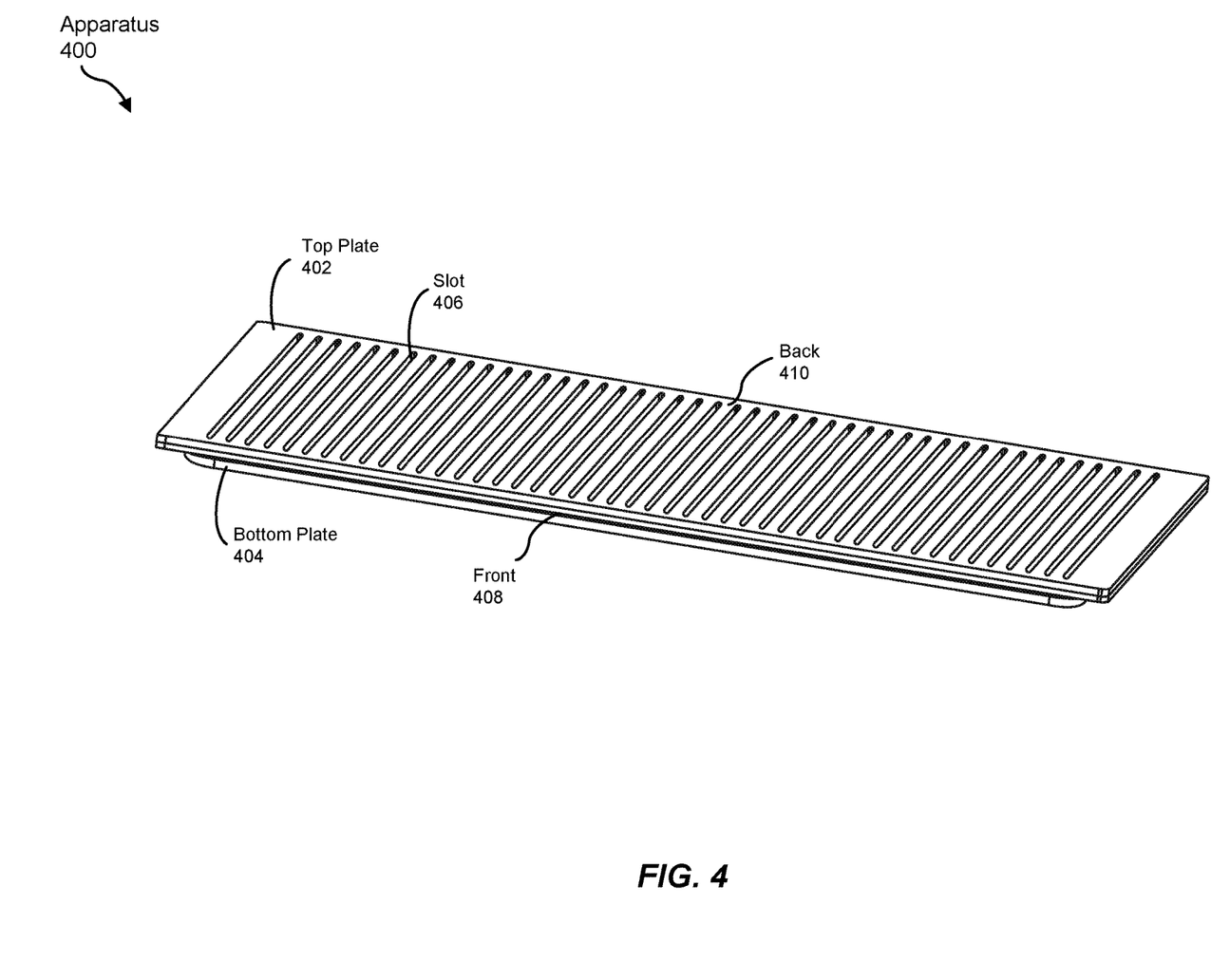
FIG. 4 is an additional illustration of an exemplary apparatus that improves the efficiency of heatsinks.

FIG. 4 illustrates an exemplary apparatus 400. In one embodiment, apparatus 400 may represent and/or include a heatsink to which apparatus 100 may be secured. As shown in FIG. 4, apparatus 400 may include a top plate 402 and a bottom plate 404. In one embodiment, top plate 402 and bottom plate 404 may be composed of a material (such as copper) that facilitates transferring and/or dissipating heat.

As shown in FIG. 4, top plate 402 may include one or more slots, such as a slot 406. Slot 406 generally represents any type or form of opening, hole, and/or cut that extends through top plate 402. In one embodiment, slot 406 may be dimensioned based on the length and/or width of bottom 104 of apparatus 100. In this way, apparatus 100 may be secured within slot 406. In some examples, apparatus 400 may secure multiple instances of apparatus 100. For example, each slot within top plate 402 may secure one instance of apparatus 100.

In some embodiments, apparatus 400 may include and/or encompass one or more vapor chambers or similar components designed to dissipate heat. The number of vapor chambers within apparatus 100 may be selected at least in part to ensure sufficient and/or optimal cooling of a device coupled to apparatus 400. In one embodiment, apparatus 100 may encompass a single vapor chamber. In other embodiments, apparatus 400 may encompass multiple vapor chambers. For example, the number of vapor chambers within apparatus 400 may correspond to the number of instances of apparatus 100 that are to be coupled to apparatus 400.

Figure 5:
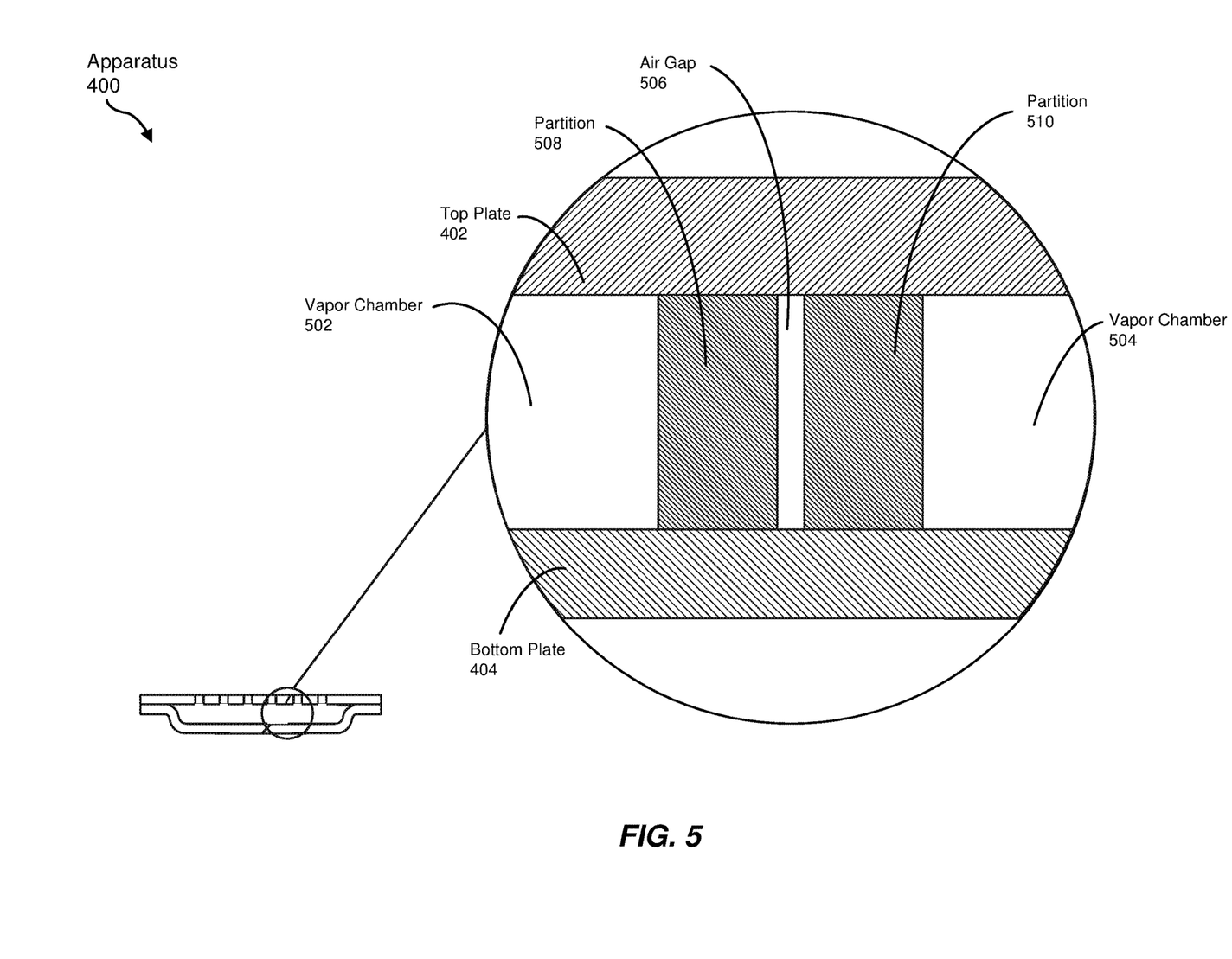
FIG. 5 is an additional illustration of an exemplary apparatus that improves the efficiency of heatsinks.

FIG. 5 illustrates a cross section of apparatus 400 that shows an exemplary configuration of vapor chambers within apparatus 400. Specifically, FIG. 5 illustrates a cross section of apparatus 400 from the perspective of viewing a front 408 of apparatus 400 (shown in FIG. 4). As shown in FIG. 5, apparatus 400 may include a vapor chamber 502 and a vapor chamber 504. In some examples, vapor chambers 502 and 504 may extend from front 408 of apparatus 400 to a back 410 of apparatus 400. Vapor chambers 502 and 504 may contain any one or more components designed to transfer and/or dissipate heat, such as a wick structure and/or working fluid.

In some embodiments, vapor chamber 502 may be isolated and/or separated from vapor chamber 504. For example, as shown in FIG. 5, apparatus 400 may include a partition 508 that bounds one side of vapor chamber 502. Apparatus 100 may also include an additional partition (not illustrated in FIG. 5) that bounds the other side of vapor chamber 502. Similarly, vapor chamber 504 may be bounded by a partition 510 and an additional partition not illustrated in FIG. 5. In one embodiment, partitions 508 and 510 may be composed of the same material (e.g., copper) as top plate 402 and/or bottom plate 404.

Partitions 508 and 510 may perform multiple functions within apparatus 400. For example, partition 508 and partition 510 may help seal working fluid within vapor chamber 502 and vapor chamber 504, respectively. In addition, partitions 508 and 510 may help thermally isolate vapor chamber 502 from vapor chamber 504. For example, partitions 508 and 510 may reduce the amount of heat transferred between vapor chamber 502 and vapor chamber 504. This thermal isolation may increase the efficiency with which both vapor chamber 502 and vapor chamber 504 dissipate heat generated by an external device. In some embodiments, vapor chambers 502 and 504 may be further separated by an air gap 506. Air gap 506 generally represents an empty space (e.g., a space not filled with working fluid or a wick structure) between partition 508 and partition 510. In one example, air gap 506 may increase and/or facilitate the thermal isolation of vapor chamber 502 and vapor chamber 504.

In some examples, apparatus 400 may contain one vapor chamber for each slot within top plate 402. For example, a vapor chamber may be positioned underneath each of these slots. In this way, each vapor chamber within apparatus 400 may be connected and/or coupled to a vapor chamber within one instance of apparatus 100. In some embodiments, each vapor chamber within apparatus 400 may be bounded and/or isolated by the same configuration of partitions and/or air gaps illustrated in FIG. 5.

Figure 6:
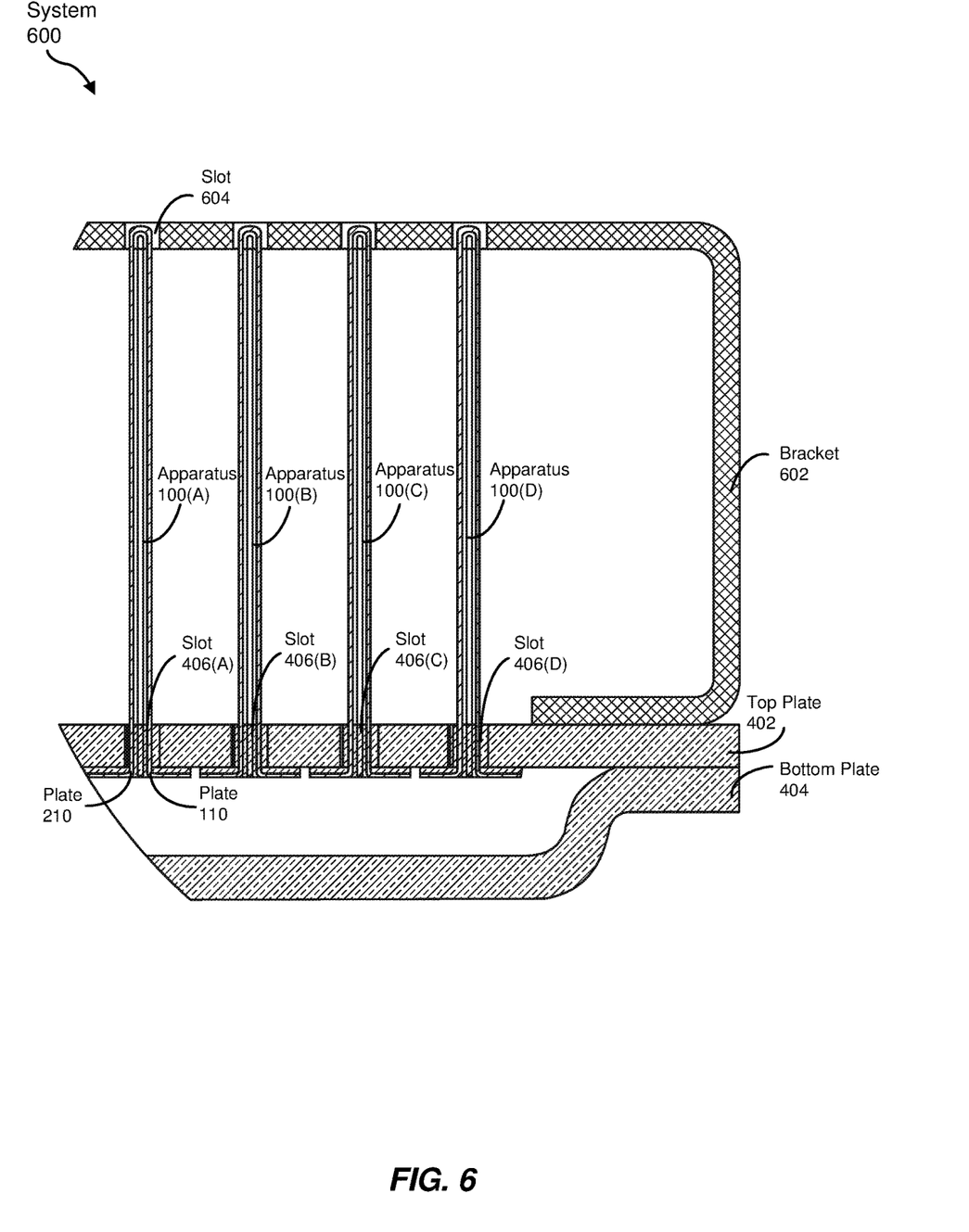
FIG. 6 is an illustration of an exemplary system for improving the efficiency of heatsinks.

FIG. 6 illustrates a system 600 that shows an exemplary configuration of multiple instances of apparatus 100 secured to apparatus 400. Specifically, FIG. 6 illustrates a partial cross section of system 600 from the perspective of viewing front 106 of each instance of apparatus 100 secured within top plate 402. In this example, top plate 402 contains at least four instances of slot 406 (i.e., slots 406(A-D)). Each of these slots may secure one instance of apparatus 100 (i.e., one of apparatuses 100(A-D)).

In system 600, the bottom sides of plate 110 and plate 210 of apparatus 100(A) may be secured within slot 406(A). For example, the portion of plate 110 that extends into slot 406(A) may be secured to one side of slot 406(A) and the portion of plate 220 that extends into slot 406(A) may be secured to the opposing side of slot 406(A). Additionally or alternatively, the bottom sides of plates 110 and 210 may be secured to the inner side of top plate 402. For example, plates 110 and 210 may include a lip or other extension that hooks underneath slot 406(A). In general, plates 110 and 210 may be secured to top plate 402 in any manner such that the bottom of plate 110 is separate from and/or not coupled to the bottom of plate 210. In this way, working fluid within the vapor chamber positioned underneath slot 406(A) may be capable of flowing into the vapor chamber within apparatus 100(A). Such a configuration may create and/or result in an extended vapor chamber that extends from apparatus 400 to apparatus 100(A). In some embodiments, this extended vapor chamber may be capable of more efficiently transferring and/or dissipating heat than traditional vapor chamber systems (e.g., vapor chambers that are contained solely within a single heatsink).

As shown in FIG. 6, system 600 may also include a bracket 602. Bracket 602 generally represents any type or form of structure, device, support, and/or mechanism that physically stabilizes one or more instances of apparatus 100. In some embodiments, bracket 602 may represent a sheet and/or cover that is coupled to top plate 402 and that extends over the top of each instance of apparatus 100 secured to apparatus 400. In some embodiments, bracket 602 may contain multiple slots, such as a slot 604. Slot 604 generally represents any type or form of groove, hole, and/or cut that extends through the top of bracket 602. In one example, slot 604 may be dimensioned based on the size of top 102 of apparatus 100. In this way, slot 604 may help secure top 102 of apparatus 100 when bottom 104 of apparatus 100 is secured within slot 406 of top plate 402. In some examples, bracket 602 may include a similar slot for each instance of apparatus 100 that is secured within top plate 402.

Figure 7:
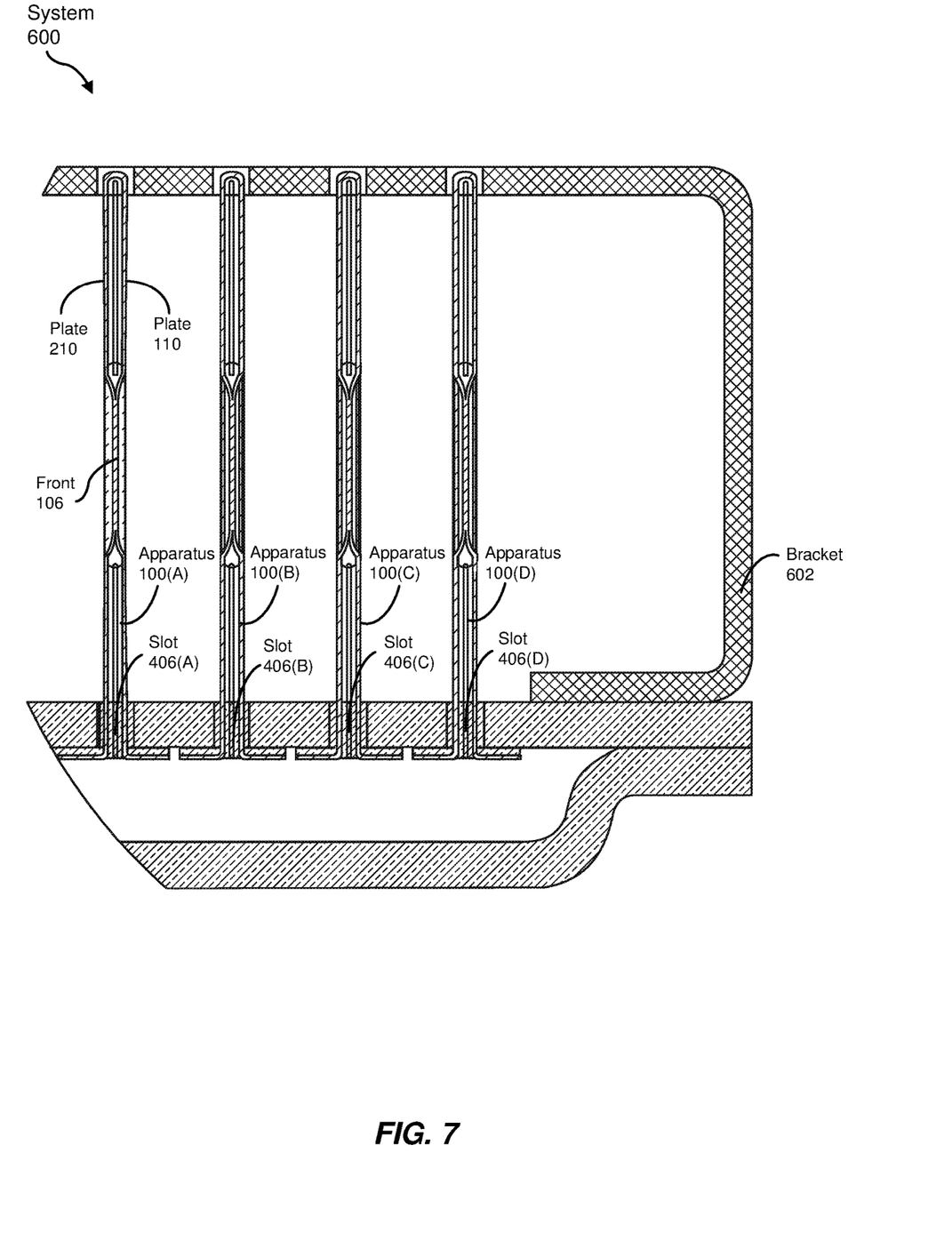
FIG. 7 an additional illustration of an exemplary system for improving the efficiency of heatsinks.

FIG. 7 illustrates an additional exemplary view of system 600. Specifically, FIG. 7 illustrates front 106 of apparatuses 100(A-D)). As mentioned above, the front sides of plates 110 and 210 of apparatus 100 may be securely bonded together (via, e.g., bond 204 shown in FIG. 2). FIG. 7 illustrates the crimped and/or angled appearance of plates 110 and 210 that may result from this bond.

Figure 8:
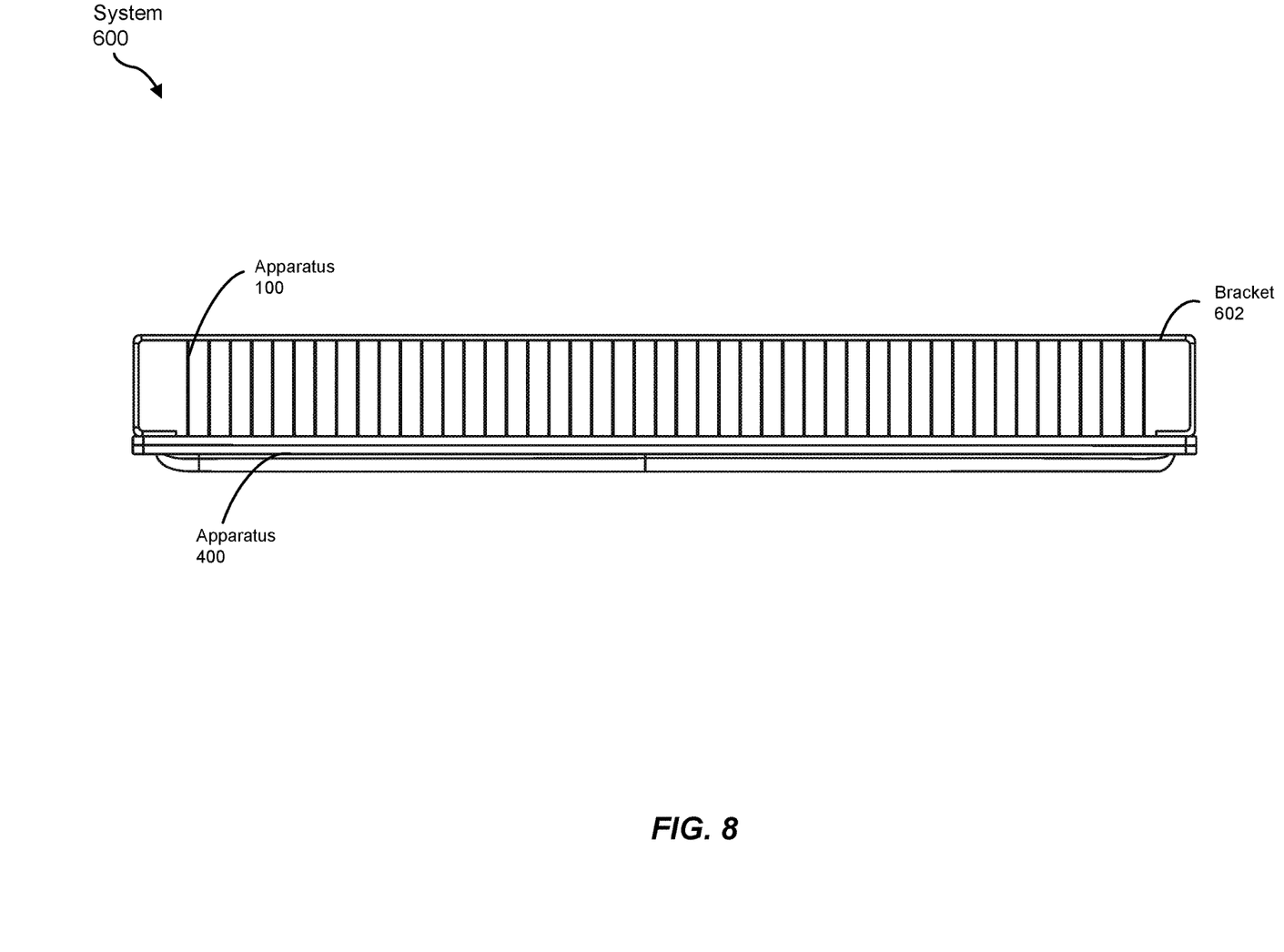
FIG. 8 an additional illustration of an exemplary system for improving the efficiency of heatsinks.

FIG. 8 illustrates another exemplary view of system 600. Specifically, FIG. 8 illustrates the entire front side of system 600. In this example, each slot within top plate 402 of apparatus 400 may secure one instance of apparatus 100. As shown in FIG. 8, bracket 602 may extend over each of these instances of apparatus 100.

Figure 9:
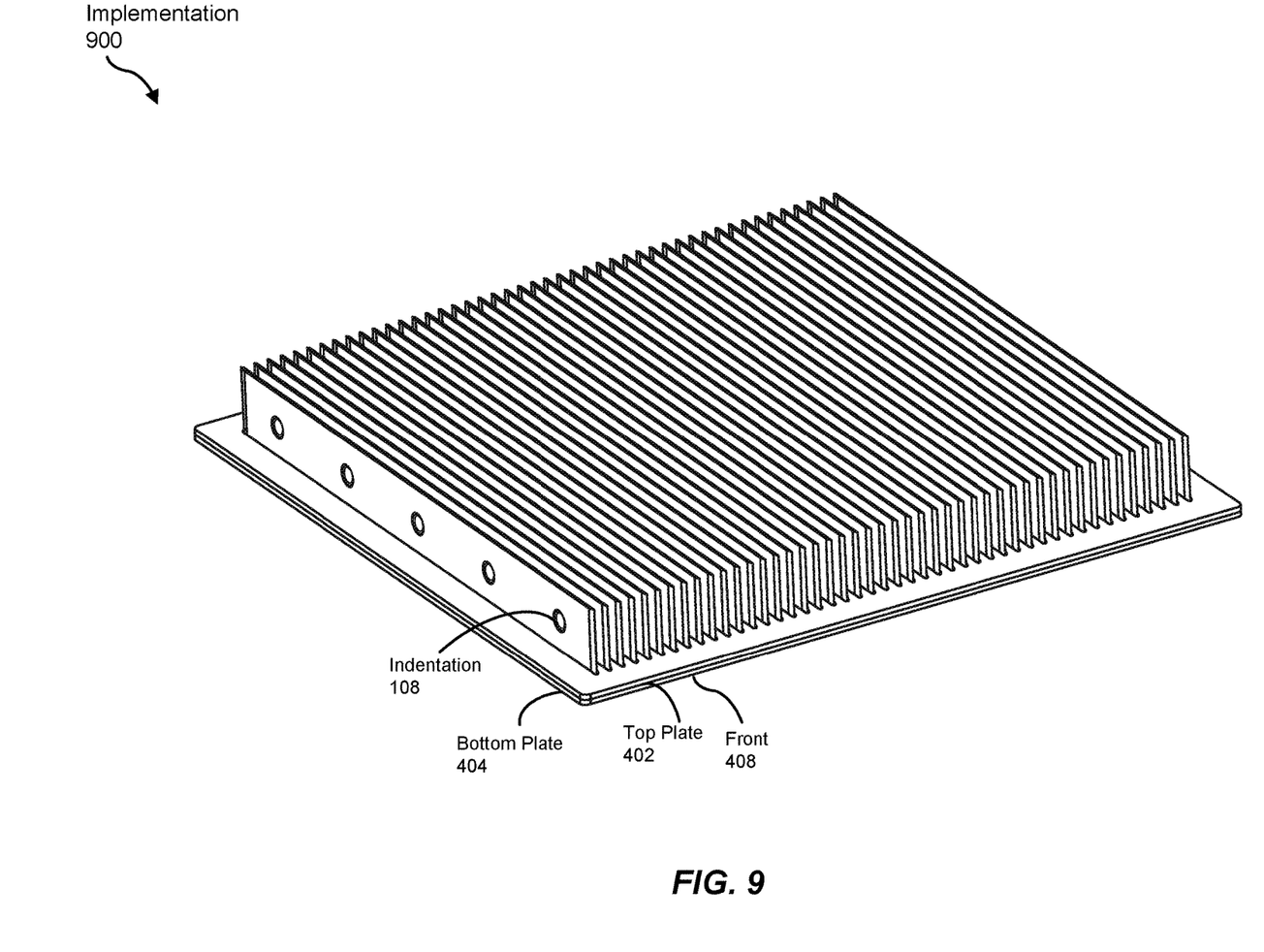
FIG. 9 an illustration of an exemplary implementation for improving the efficiency of heatsinks.

FIG. 9 illustrates an exemplary implementation 900 of system 600. Specifically, implementation 900 shows a perspective view of system 600 after one instance of apparatus 100 has been secured within each slot of top plate 402 and before bracket 602 is fastened to top plate 402. In one embodiment, each instance of apparatus 100 may be secured within top plate 402 before bottom plate 404 is coupled to top plate 402. This method of assembly may enable a manufacturer to easily access the bottom sides of plates 110 and 210 while securing apparatus 100 within slot 406.

After each instance of apparatus 100 has been secured to top plate 402, bottom plate 404 may be coupled to top plate 402 (via, e.g., soldering, welding, bolting, or otherwise fastening the plates). Next, each vapor chamber within apparatus 400 may be filled with working fluid. For example, top plate 402 and/or bottom plate 404 may contain multiple holes or openings (e.g., so-called fill holes) that facilitate inserting working fluid into vapor chambers within apparatus 400. Specifically, apparatus 400 may contain a separate fill hole for each vapor chamber within apparatus 400. These fill holes may enable individual vapor chambers to be filled with working fluid such that the working fluid within each vapor chamber of apparatus 400 is separated and/or partitioned from other vapor chambers. After a sufficient amount of working fluid has been inserted via each fill hole within apparatus 400, the fill holes may be sealed and/or closed such that working fluid is securely contained within each distinct vapor chamber.

Figure 10:
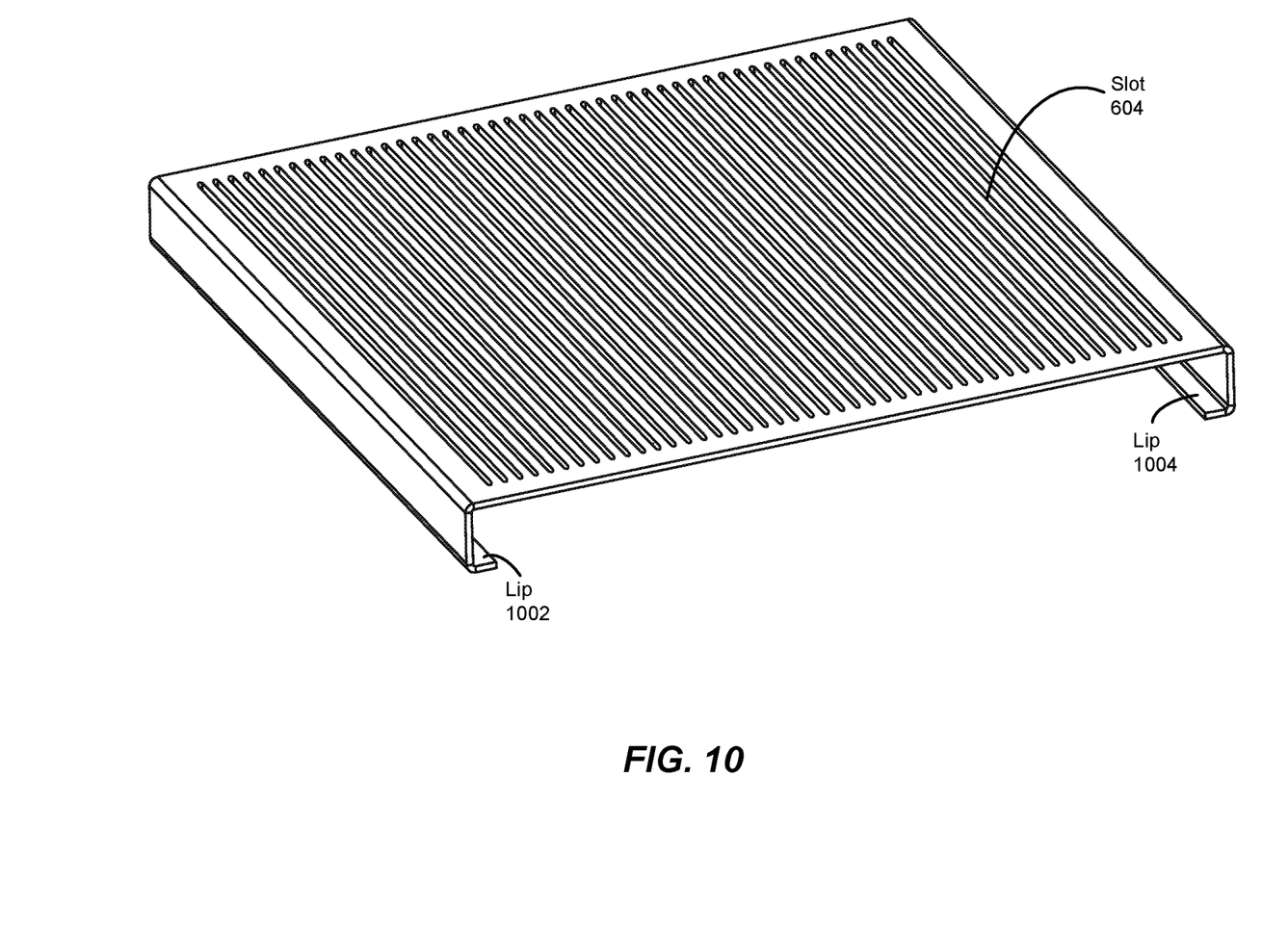
FIG. 10 is an illustration of an exemplary component of a system for improving the efficiency of heatsinks.

FIG. 10 illustrates an exemplary embodiment of bracket 602. As mentioned above, the size of slot 604 within bracket 602 may correspond to and/or be based on the size of top 102 of apparatus 100. In some examples, bracket 602 may contain a similar slot for each instance of apparatus 100 that is secured to apparatus 400. When bracket 602 is placed over the tops of each of these instances of apparatus 100, bracket 602 may prevent and/or reduce their movement. As such, bracket 602 may help maintain the pitch (e.g., spacing) of each instance of apparatus 100. By maintaining the pitch of each instance of apparatus 100, bracket 602 may increase the efficiency with which each instance of apparatus 100 transfers and/or dissipates heat. In some examples, bracket 602 may also act as a heatsink that further facilitates transferring and/dissipating heat. For example, bracket 602 may be composed of a heatsink material (such as aluminum or copper).

As shown in FIG. 10, bracket 602 may contain a lip 1002 and a lip 1004. Lips 1002 and 1004 generally represent any platform and/or extension of bracket 602 that facilitate fastening bracket 602 to top plate 402 of apparatus 400. In general, bracket 602 may be fastened to apparatus 400 in any manner such that the slots within bracket 602 physically stabilize all or a portion of the instances of apparatus 100 coupled to apparatus 400.

Figure 11:
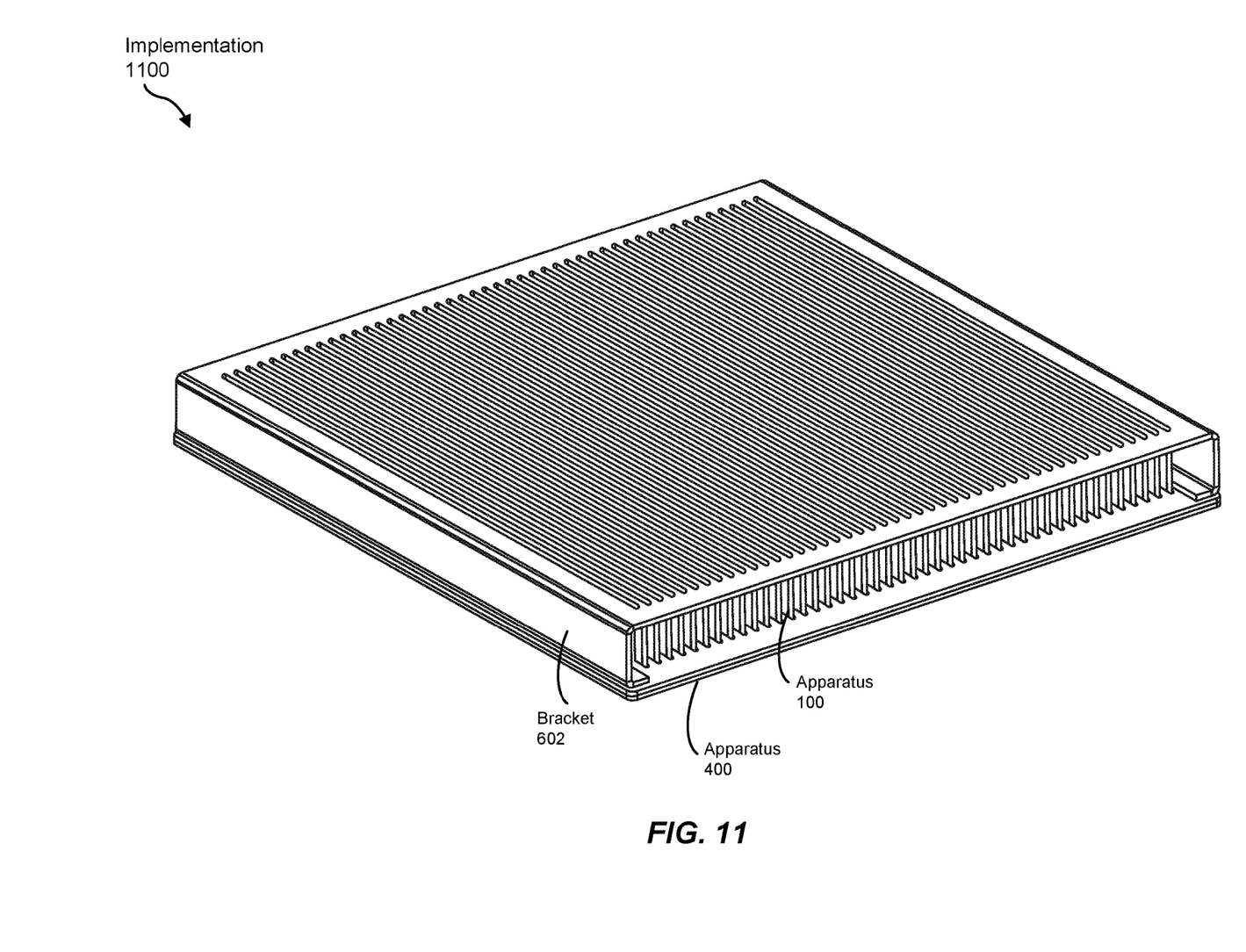
FIG. 11 is an additional illustration of an exemplary implementation for improving the efficiency of heatsinks.

FIG. 11 illustrates an exemplary implementation 1100 of system 600. Specifically, implementation 1100 shows system 600 after bracket 602 has been coupled to implementation 900 of system 600 shown in FIG. 9. In one embodiment, implementation 1100 of system 600 may represent a complete heatsink assembly that contains a heatsink base (e.g., apparatus 400), multiple vapor chamber fins (e.g., multiple instances of apparatus 100), and a stabilizing bracket (e.g., bracket 602).

In some embodiments, implementation 1100 of system 600 may be coupled and/or secured to one or more electrical and/or mechanical devices that generate heat. In one example, this device may represent an Application-Specific Integrated Circuit (ASIC) chip that consumes a large amount of power (e.g., 200-250 Watts). In another example, this device may represent a multi-module chip that contains various components, such as an ASIC chip and one or more high-bandwidth memory (HBM) chips. These devices may be coupled to system 600 in any suitable manner that facilitates heat transfer between the device and system 600. For example, a heat-generating device may be coupled (e.g., bolted, screwed, soldered, and/or otherwise fastened) to bottom plate 404 of apparatus 400. While this device is operational (and therefore generating heat), the various heatsinks and vapor chambers within system 600 may transfer the generated heat away from the device. As such, system 600 may ensure that the device may maintains an ideal operating temperature, thereby improving the performance and/or safety of the device.

Figure 12:
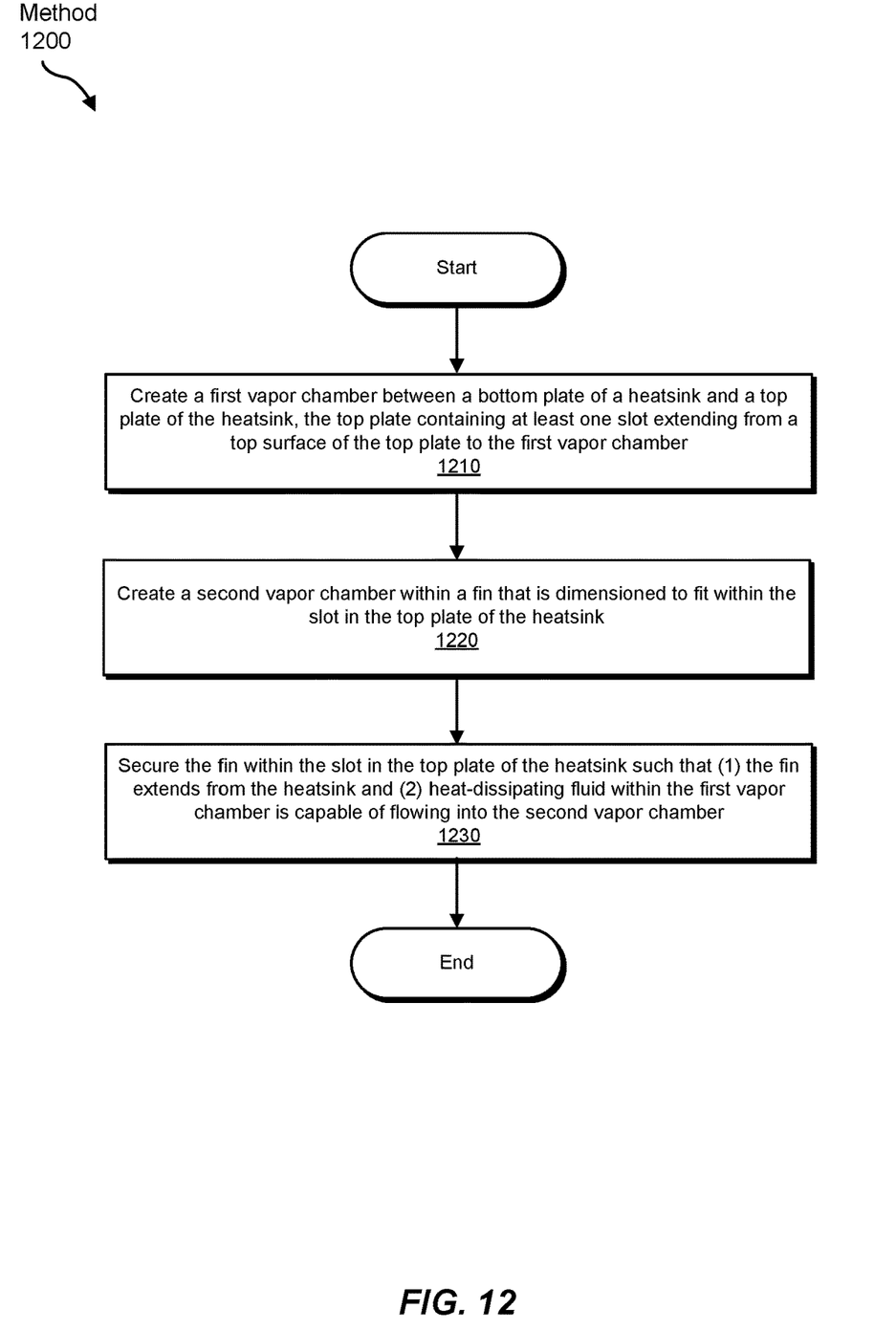
FIG. 12 is a flow diagram of an exemplary method for improving the efficiency of heatsinks.

FIG. 12 is a flow diagram of an exemplary method 1200 for improving the efficiency of heatsinks. Method 1200 may include the step of creating a first vapor chamber between a bottom plate of a heatsink and a top plate of the heatsink (1210). In one example, this top plate may contain at least one slot that extends from a top surface of the top plate to the first vapor chamber.

Step 1210 may be performed in a variety of ways. For example, a heatsink manufacturer may machine and/or assemble the components of apparatus 400, including bottom plate 404 and/or top plate 402. In one embodiment, the manufacturer may machine one or more slots (such as slot 406) within top plate 402. These slots may be designed and/or dimensioned to hold and/or secure apparatus 100. In addition, the manufacturer may machine one or more fill holes within bottom plate 404.

After creating top plate 402 and bottom plate 404, the manufacturer may assemble and/or couple one or more vapor chambers to the plates. For example, the manufacturer may secure multiple partitions (such as partitions 508 and 510) to top plate 402 and/or bottom plate 404. These partitions may create and/or define multiple vapor chambers. Specifically, the manufacturer may create and/or define distinct vapor chambers that correspond to each slot within top plate 402. The manufacturer may also secure one or more vapor chamber components (such as a wick structure) within each vapor chamber. In one embodiment, this step of creating vapor chambers within apparatus 400 may be at least partially completed before coupling top plate 402 to bottom plate 404.

Returning to FIG. 12, method 1200 may also include the step of creating a second vapor chamber within a fin that is dimensioned to fit within the slot in the top plate of the heatsink (1220). This step may be performed at any point before, during, and/or after performing step 1210.

Step 1220 may be performed in a variety of ways. For example, the heatsink manufacturer may machine and/or assemble the components of apparatus 100. Specifically, the manufacturer may couple wick 202 to plate 110 and/or plate 220. The manufacturer may also bond one or more (but not all) of the sides of plate 110 to sides of plate 220. In some embodiments, the manufacturer may create multiple instances of apparatus 100. For example, the manufacturer may create one instance of apparatus 100 for each slot machined into top plate 402.

Returning to FIG. 12, method 1200 may include the step of securing the fin within the slot in the top plate of the heatsink such that (1) the fin extends from the heatsink and (2) heat-dissipating fluid within the first vapor chamber is capable of flowing into the second vapor chamber (1230).

Step 1230 may be performed in a variety of ways. For example, the manufacturer may insert apparatus 100 into slot 406 of top plate 402. The manufacturer may then secure and/or seal apparatus 100 within slot 406. Specifically, the manufacturer may secure the bottom of plate 110 to one side of slot 406 and the bottom of plate 220 to the opposite side of slot 406. The manufacturer may also create a seal between the outside of plates 110 and 220 and the top surface of top plate 402. In this way, the manufacturer may prevent fluid that is to flow from apparatus 400 to apparatus 100 from leaking where the apparatuses are joined. In some embodiments, the manufacturer may secure and/or seal an instance of apparatus 100 into each slot machined into top plate 402.

After each instance of apparatus 100 is coupled to top plate 402, the manufacturer may couple bottom plate 404 to top plate 402. For example, the manufacturer may seal, bond, and/or otherwise fasten these plates together. The manufacturer may then fill each vapor chamber within apparatus 400 with working fluid. Specifically, the manufacturer may insert the working fluid into the fill holes machined into bottom plate 404. In this way, the manufacturer may create multiple extended vapor chambers. For example, each of these extended vapor chambers may represent a contiguous vapor chamber that extends from apparatus 400 to an instance of apparatus 100.

In some embodiments, the manufacturer may also fasten bracket 602 to top plate 402. This step may complete the assembly of system 600. The manufacturer may then couple system 600 to a heat-generating device (such as an ASIC chip). While the device operates, the working fluid within each extended vapor chamber of apparatus 400 may absorb heat generated by the device. When the working fluid within an extended vapor chamber reaches its boiling point, the fluid may evaporate and flow up into the portion of the extended vapor chamber contained within apparatus 100. After reaching the top of apparatus 100, the fluid may condense and then travel back to apparatus 400 via wick structures within apparatus 100 and/or apparatus 400.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
a heatsink that includes a first vapor chamber that:
contains fluid that dissipates heat; and
is at least partially encompassed by a plate that contains at least one slot extending from a top surface of the plate to the first vapor chamber;
at least one fin that:
encompasses a second vapor chamber; and
is secured within the slot in the plate of the heatsink such that:
the fin extends from the heatsink; and
the fluid within the first vapor chamber is capable of flowing into the second vapor chamber; and a bracket that is fastened to the plate of the heatsink by at least one lip and extends beyond a length of a top of the fin, wherein the bracket comprises:
 a plate positioned parallel to the plate of the heatsink; and
 at least one slot hole that extends through the plate of the bracket, wherein the slot hole:
  is dimensioned to fit the length of the top of the fin;
  physically stabilizes the top of the fin; and
  enables airflow to pass over the top of the fin.

2. The apparatus of claim 1, wherein:
the first vapor chamber comprises a first wick structure; and
the second vapor chamber comprises a second wick structure that is physically separated from the first wick structure.

3. The apparatus of claim 1, wherein:
the heatsink further comprises an additional plate that is coupled to the plate that contains the slot; and
the first vapor chamber is encompassed by the additional plate and the plate that contains the slot.

4. The apparatus of claim 1, wherein the fin comprises a first plate and a second plate that encompass the second vapor chamber.

5. The apparatus of claim 4, wherein:
the first plate of the fin is secured to one side of the slot in the plate of the heatsink; and
the second plate of the fin is secured to an opposing side of the slot in the plate of the heatsink such that the fluid within the first vapor chamber is capable of flowing into the second vapor chamber.

6. The apparatus of claim 4, wherein:
the first plate of the fin contains at least one indentation; and
the second plate of the fin contains at least one additional indentation that makes physical contact with the indentation in the first plate of the fin.

7. The apparatus of claim 6, wherein the physical contact between the indentation in the first plate of the fin and the additional indentation in the second plate of the fin improves structural integrity of the fin.

8. The apparatus of claim 1, wherein the bracket is composed of aluminum.

9. The apparatus of claim 1, wherein:
the plate of the heatsink contains a plurality of slots; and
each of the plurality of slots secures a fin that encompasses a vapor chamber.

10. A system comprising:
a device that generates heat;
a heatsink that:
 is coupled to the device; and
 includes a first vapor chamber that:
  contains fluid that dissipates heat; and
  is at least partially encompassed by a plate that contains at least one slot extending from a top surface of the plate to the first vapor chamber;
 at least one fin that:
  encompasses a second vapor chamber; and
  is secured within the slot in the plate of the heatsink such that:
   the fin extends from the heatsink; and
   the fluid within the first vapor chamber is capable of flowing into the second vapor chamber; and
a bracket that is fastened to the plate of the heatsink by at least one lip and extends beyond a length of a top of the fin, wherein the bracket comprises:
 a plate positioned parallel to the plate of the heatsink; and
 at least one slot hole that extends through the plate of the bracket wherein the slot hole:
  is dimensioned to fit the length of the top of the fin;
  physically stabilizes the top of the fin; and
  enables airflow to pass over the top of the fin.

11. The system of claim 10, wherein:
the heatsink further comprises an additional plate that is coupled to the plate that contains the slot; and
the first vapor chamber is encompassed by the additional plate and the plate that contains the slot.

12. The system of claim 11, wherein the device is coupled to the additional plate of the heatsink.

13. The system of claim 10, wherein the fin comprises a first plate and a second plate that encompass the second vapor chamber.

14. The system of claim 13, wherein the second vapor chamber comprises a wick structure that is coupled to both an inner side of the first plate and an inner side of the second plate.

15. The apparatus of claim 9, further comprising a plurality of partitions secured to the plate of the heatsink, wherein each of the plurality of partitions:
 is positioned between two of the plurality of slots; and
 at least partially prevents heat transfer between vapor chambers encompassed by fins secured in the two slots.

16. The apparatus of claim 15, wherein each of the plurality of partitions comprises a region of empty space.

17. A method comprising:
creating a first vapor chamber between:
 a bottom plate of a heatsink; and
 a top plate of the heatsink, the top plate containing at least one slot extending from a top surface of the top plate to the first vapor chamber;
creating a second vapor chamber within a fin that is dimensioned to fit within the slot in the top plate of the heatsink;
securing the fin within the slot in the top plate of the heatsink such that:
 the fin extends from the heatsink; and
 heat-dissipating fluid within the first vapor chamber is capable of flowing into the second vapor chamber; and
fastening, to the top plate of the heatsink, a bracket that extends beyond a length of a top of the fin, wherein the bracket comprises:
 a plate positioned parallel to the plate of the heatsink; and
 at least one slot hole that extends through the plate of the bracket, wherein the slot hole:
  is dimensioned to fit the length of the top of the fin;
  physically stabilizes the top of the fin; and
  enables airflow to pass over the top of the fin.

18. The method of claim 17, wherein encompassing the first vapor chamber between the bottom plate of the heatsink and the top plate of the heatsink comprises coupling the bottom plate to the top plate after both:
 securing at least a portion of the first vapor chamber to the top plate; and
 securing the fin within the slot in the top plate.

19. The method of claim 17, further comprising filling the first vapor chamber with the heat-dissipating fluid after securing the fin within the slot in the top plate of the heatsink.

* * * * *